United States Patent [19]
Seo et al.

[11] Patent Number: 5,621,679
[45] Date of Patent: Apr. 15, 1997

[54] SEMICONDUCTOR MEMORY DEVICE FOR ACHIEVING HIGH BANDWIDTH AND METHOD FOR ARRANGING SIGNAL LINES THEREFOR

[75] Inventors: Dong-Il Seo, Suwon; Se-Jin Jeong, Seoul, both of Rep. of Korea

[73] Assignee: Samsung Electronics Co., Ltd., Suwon, Rep. of Korea

[21] Appl. No.: 445,784

[22] Filed: May 22, 1995

[30] Foreign Application Priority Data

May 20, 1994 [KR] Rep. of Korea .................. 11050/1994

[51] Int. Cl.⁶ ..................................................... G11C 5/06
[52] U.S. Cl. ........................ 365/63; 365/51; 365/230.03
[58] Field of Search ......................... 365/63, 51, 230.03; 257/351, 369, 903, 69

[56] References Cited

U.S. PATENT DOCUMENTS

| | | | |
|---|---|---|---|
| 5,291,432 | 3/1994 | Furutani | 365/63 |
| 5,293,559 | 3/1994 | Kim et al. | 365/63 |
| 5,325,336 | 6/1994 | Tomishima et al. | 365/63 |
| 5,457,648 | 10/1995 | Eisig | 365/63 |

*Primary Examiner*—David C. Nelms
*Assistant Examiner*—Vu A. Le
*Attorney, Agent, or Firm*—Cushman Darby & Cushman IP Group Of Pillsbury Madison & Sutro LLP

[57] ABSTRACT

The present invention relates to a semiconductor memory device and more particularly to a semiconductor memory device and a method for arranging a signal line therein which can realize a high bandwidth by embodying a chip architecture being comprised of a multi I/O line. A semiconductor memory device includes arrays comprised of a plurality of reference blocks for storing a plurality of memory cells, a plurality of word lines extending in the direction of length of a chip, a plurality of bit lines extending in a vertical direction of length of a chip, each pair of bit lines being comprised of a bit line and a complementary bit line, a plurality of data I/O lines arranged on the upper portion of the arrays and extending in the vertical direction, each pair of data I/O lines being comprised of a data I/O line and a complementary data I/O line and being one by one connected to each pair of bit lines, and a plurality of column selection lines arranged in the vertical direction and adjacent to the data I/O line and complementary data I/O line, for controlling connection of each pair of bit lines to the data I/O lines.

8 Claims, 11 Drawing Sheets

SEMICONDUCTOR MEMORY DEVICE FOR ACHIEVING HIGH BANDWIDTH AND METHOD FOR ARRANGING SIGNAL LINES THEREFOR

BACKGROUND OF THE INVENTION

The present invention relates to a semiconductor memory device and more particularly to a semiconductor memory device and a method for arranging signal lines therein which can realize a high bandwidth by embodying chip architecture being comprised of a multi I/O line.

In designing a semiconductor memory device, one of the most important details is to select an appropriate chip architecture. Parameters indicating performance of the semiconductor memory device, for example, power-consumption, operation speed, chip size, etc. are dependent upon the chip architecture. In other words, an excellent flexibility of the chip architecture greatly contributes to satisfaction of the requirements of such parameters. In practical chip architecture, design, as apparent to one skilled in the art, it is further noted that flexibility of the chip architecture enables its base structure to be maintained without any changes, when changing or adding a peripheral circuit, or increasing the density of the semiconductor memory device. Also, the flexibility of the chip architecture can easily respond to these variations. Now, an object of developing a semiconductor memory device includes achieving a high bandwidth in proportion to the high density of a semiconductor memory device. In other words, a concept of the semiconductor memory device has been changed from one of a simple high density memory device to a new one in which the memory device has the high bandwidth and is synchronized with the speed of a system. For example, in the case of memory device having a capacity of 64M or more, in particular, RAM bus dynamic RAM or synchronous dynamic RAM with a mother version as 256M dynamic RAM, one operational cycle should process data of 256 bits. Therefore, to satisfy the development trend of semiconductor memory devices toward the high bandwidth, the architecture of the memory device to be used with a mother version of 256 bits should have an internal bandwidth of 256 bits (one cycle). Many memory device designers are studying an architecture having a possible high bandwidth. Meanwhile, the higher the density of the memory device is, the larger the size of the chip. As a result, reading and writing data is difficult due to the increment for loading of each line. This difficulty creates an absolute need for a new architecture.

FIG. 1 shows a construction of chip architecture for 256M in a conventional semiconductor memory device. Further, the circuit construction of internal columns based on the chip architecture shown in FIG. 1 is disclosed in, for instance, U.S. Pat. No. 5,247,482, entitled "Semiconductor Memory Device With High Speed Write Operation". When selecting a conventional folded bit line structure in order to constitute a 256M DRAM, 32K word lines and 16K bit lines are necessary. Of course, 512 cells will be able to be connected to one bit line, but it is common that 256 cells are connected to one bit line. Therefore, an array of 2M can be activated by one word line. Here, it is assumed that if a refresh cycle corresponds to 16K, two word lines would be enabled in the length direction of the chip by the activation of a row address strobe signal $\overline{RAS}$. Thereby, the whole 256M, arrays of 8M would be activated. If the arrays are activated as depicted in FIG. 1 and two pairs of I/O lines are positioned in a sense amplifier area, the number of bits of data processed in a 2M array is 4, which corresponds to the number of I/O lines. Thus, in whole 256M, 16 bits of data can be possessed. Since this differs greatly from a desired internal bandwidth of 256 bits, a practical achievement of high bandwidth is impossible. Further, the high bandwidth can not be realized with the above-mentioned chip architecture. Also, in this chip architecture, loading of I/O lines as well as junction loading of gate transistors for connecting the I/O line to a bit line are great, which can lead to difficulties in developing a voltage on the I/O line upon performance of a read operation. Further, upon performance of a write operation, since the data I/O line shown in FIG. 1 is directly connected to the bit line through the gate transistor, the junction loading and bit line are hurt. For that reason, it is appreciated that the construction of FIG. 1 is not suitable for the high density memory device.

FIG. 2 shows another embodiment of a conventional semiconductor memory device, through which a high bandwidth can be achieved, compared with that of FIG. 1 and in which the line loading of FIG. 1 is greatly reduced. FIG. 2 is disclosed in "Circuit Techniques For a Wide Word I/O Path 64 Mega DRAM" on pp. 133–134 of a paper in "1991 SYMPOSIUM ON VLSI CIRCUITS". For details of FIG. 2, the above paper will be helpful. In the figure, the loading of I/O lines is reduced by using sub I/O lines and a local I/O lines. Also, a predetermined number of sense amplifiers are integrated to the sub I/O line, to transmit data to the local I/O line through a differential amplifier. This prior art may have an internal bandwidth to some extent, but it is disadvantageous in that the number of NMOS transistors through which data is transmitted is large, upon performance of a write operation. FIG. 3 is a block diagram illustrating the data I/O lines of FIG. 2. Upon performance of a write operation, data on the local I/O line is transmitted to a transistor 2 of FIG. 2 by the enable of a signal SEC SELECT having column information of a selected block, but if a signal YWRITE for determining sub I/O line is enabled, the data is transmitted to the sub I/O line through a transistor 4. If an information signal S/A SELECT of a predetermined bit line selected in a plurality of bit lines connected to a single sub I/O line is enabled, the data is transmitted to the bit line through a transistor 10. As mentioned above, when the write operation is performed, since the data transmission is made from the I/O line to the bit line only through three NMOS transistors, it is seriously disadvantageous in performing a write operation in a high integrated memory device having great line loading.

SUMMARY OF THE INVENTION

Therefore, an object of the present invention is to provide a semiconductor memory device and a method for arranging signal lines therein which embodies a chip architecture where a high bandwidth can be realized.

Another object of the present invention is to provide a semiconductor memory device and a method for arranging signal lines therein which are embodied by a chip architecture where a high speed data access operation can be executed, upon performance of read and write operations.

Still another object of the present invention is to provide a semiconductor memory device and a method for arranging signal lines therein which can improve a line loading problem of bit line and I/O lines, upon data transmission.

A further object of the present invention is to provide a semiconductor memory device and a method for arranging signal lines therein which are embodied by a chip architecture where a high bandwidth without requiring a separate local I/O line for connecting a bit line and a main I/O lines can be realized and a write operation at a high speed can be performed.

To achieve these and other objects, there is provided a semiconductor memory device embodied by a chip architecture wherein a desired high bandwidth can be realized.

According to an aspect of the present invention, a semiconductor memory device has an architecture in which a plurality of bit lines transmitting a plurality of memory cells and cell data are connected to corresponding data I/O lines, each of which is in independent connecting state to each other, thereby achieving a high bandwidth.

According to another aspect of the present invention, a semiconductor memory device includes row decoders for arranging a plurality of word lines in the direction of length of a chip, and column decoders for arranging a plurality of bit lines and a plurality of column selection lines in the direction perpendicular to the length of the chip.

According to another aspect of the present invention, a semiconductor memory device includes an architecture in which a plurality of main I/O lines are one by one connected to a plurality of data I/O lines, being arranged between the bit lines and the data I/O terminal of a chip.

According to another aspect of the present invention, a semiconductor memory device includes arrays comprised of a plurality of reference blocks storing a plurality of memory cells, a plurality of word lines extending in the direction of length of a chip, a plurality of bit lines extending in a vertical direction of length of a chip, each pair of bit lines being comprised of a bit line and a complementary bit line, a plurality of data I/O lines arranged on the upper portion of the arrays and extending in the vertical direction, each pair of data I/O lines being comprised of a data I/O line and a complementary data I/O line and being one by one connected to each pair of bit lines, and a plurality of column selection lines arranged in the vertical direction and adjacent to the data I/O line and complementary data I/O line, for controlling connection of each pair of bit lines to the data I/O lines.

According to another aspect of the present invention, a method for arranging signal lines in a semiconductor memory device comprises the steps of arranging arrays comprised of a plurality of reference blocks for storing a plurality of memory cells, arranged in a matrix form, arranging a plurality of word lines for selecting rows of the memory cells, which word lines extend in the length direction of a chip, arranging a plurality of bit lines extending in a vertical direction of length of a chip, for selecting columns of the memory cells, each pair of bit lines being comprised of a bit line and a complementary bit line, arranging a plurality of data I/O lines arranged on the upper portion of the arrays and extending in the vertical direction, each pair of data I/O lines data I/O lines being comprised of a data I/O line and a complementary data I/O line and being one by one connected to each pair of bit lines, and arranging a plurality of column selection lines arranged in the vertical direction and adjacent to the data I/O line and complementary data I/O line, for controlling connection of each pair of bit lines to the data I/O line.

BRIEF DESCRIPTION OF THE DRAWINGS

The following is a detailed description of this invention by reference to the attached drawings, in which like numbers indicate the same or similar elements.

DETAILED DESCRIPTION OF THE PREFERRED EMBODIMENTS

In the following description, numerous specific details, such as vertical structure of I/O lines, bit line sensing circuits, multiplexers and so on, are set forth in order to provide a thorough understanding of the present invention. It will be understood by those skilled in the art that other embodiments of the present invention may be practiced without these specific details, or with alternative specific details.

The term "unit array" as used herein refers to a cell array which can be activated by a single word line. The term "sub array" is used to describe a cell array which can be selected by a single row decoder group and a single column decoder group, which is comprised of a plurality of unit arrays commonly having a data I/O line connected to a single multiplexer group.

Figure 1:
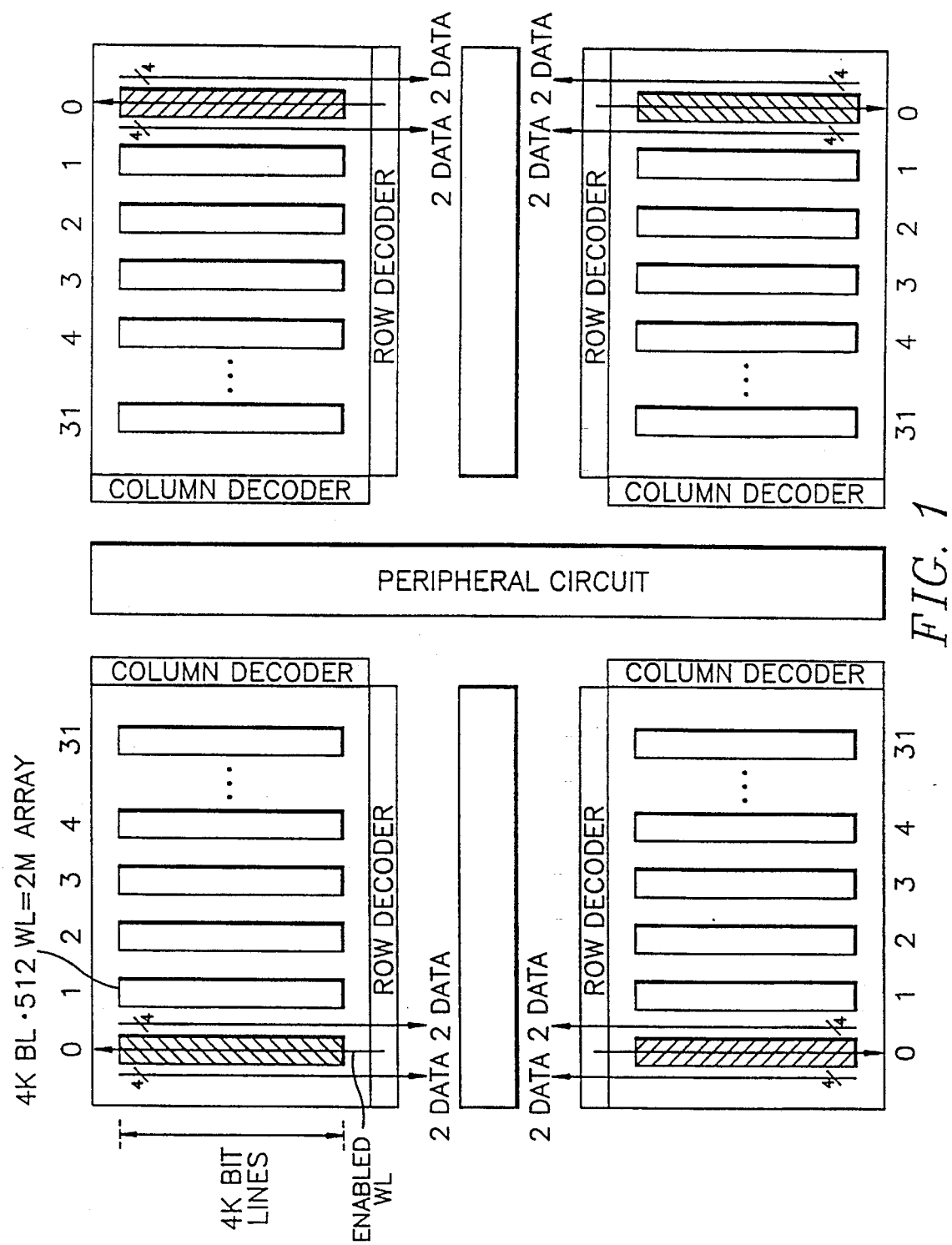
FIG. 1 is a schematic block diagram illustrating a configuration of a chip architecture in a conventional semiconductor memory device.
Figure 4A:
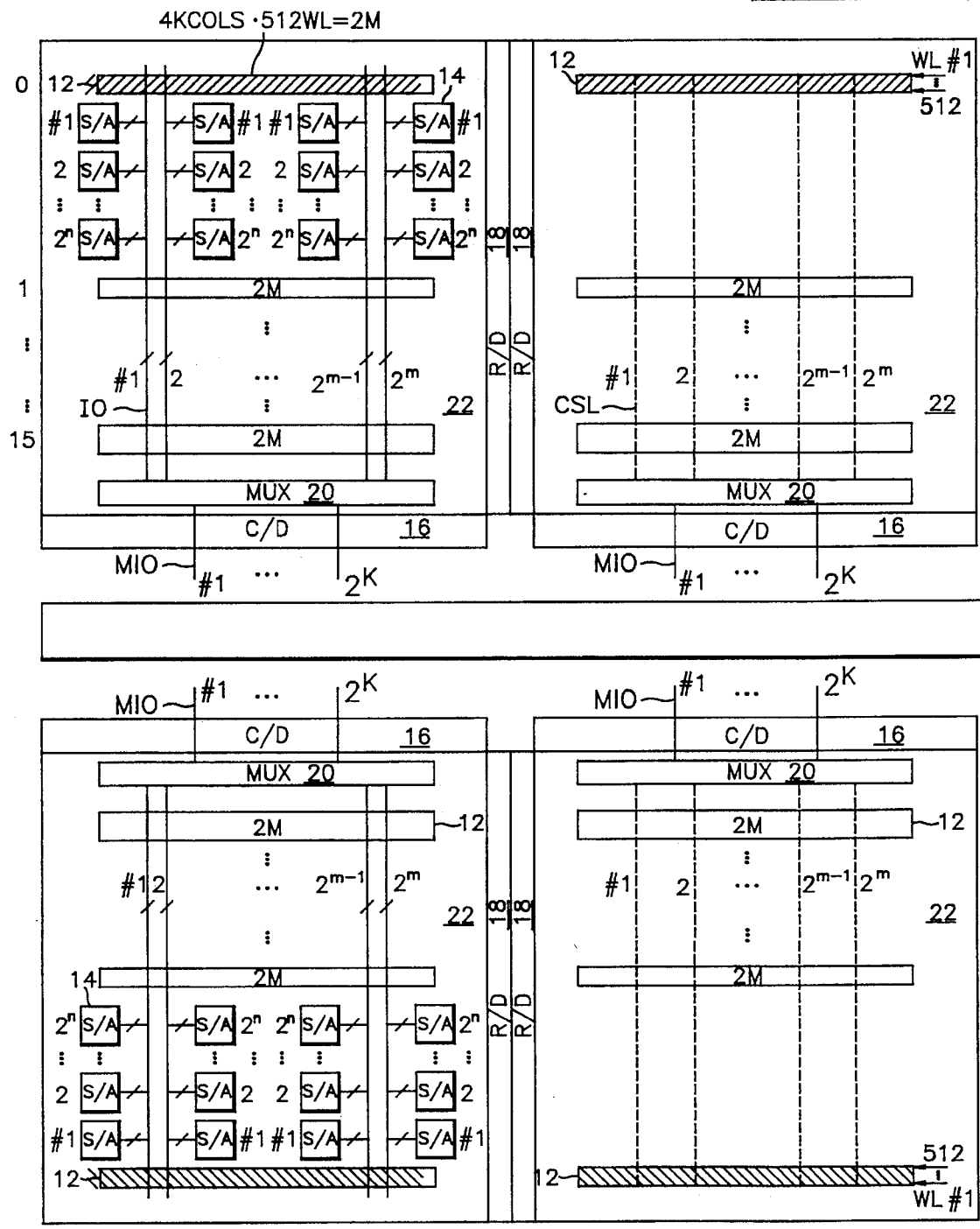
FIG. 4 is a block diagram illustrating a configuration of a chip architecture having a multi I/O line of a semiconductor memory device according to the principles of the present invention, which is comprised of FIGS. 4A and 4B arranged in a parallel pattern in a chip.
Figure 4B:
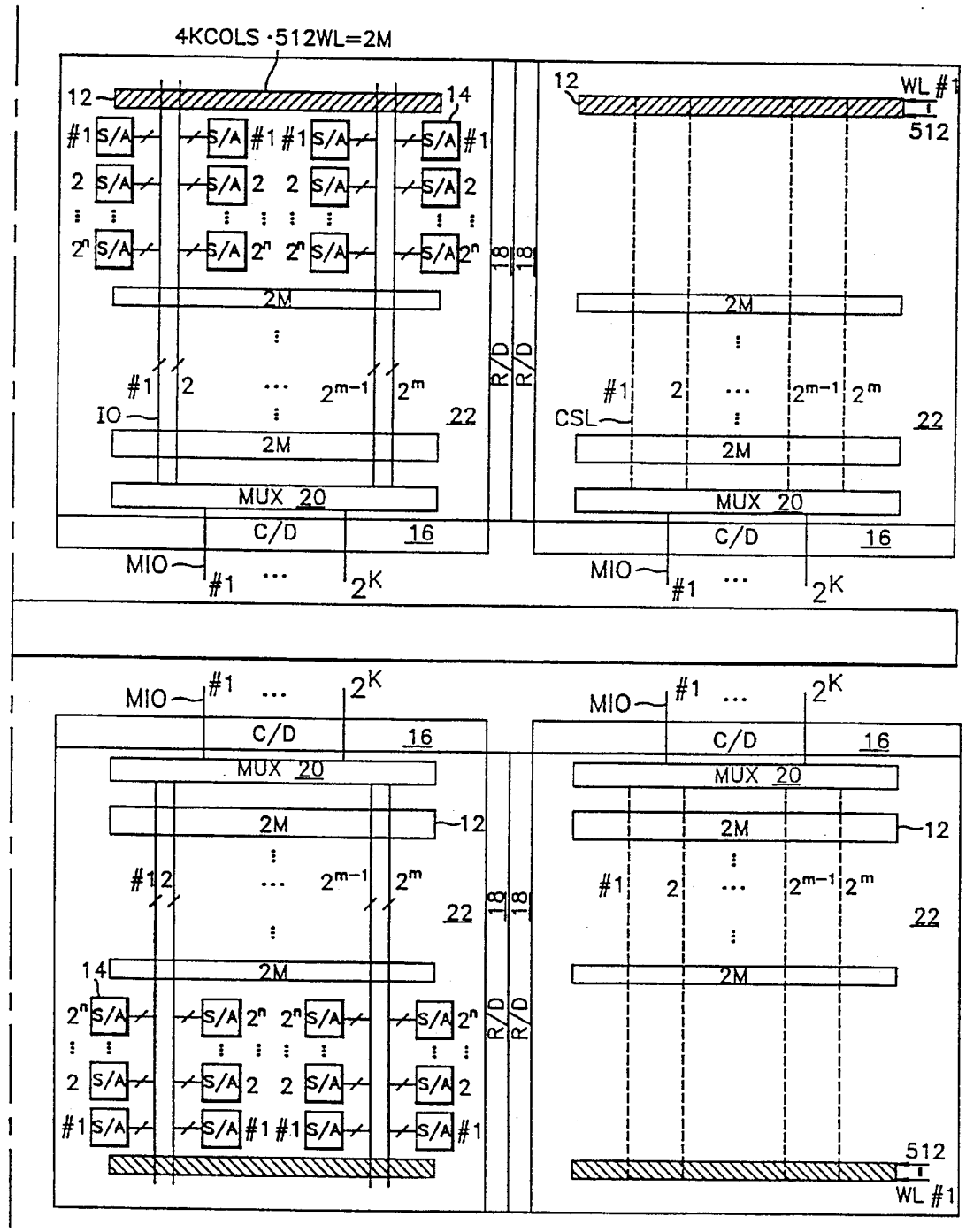

FIG. 4 is a block diagram illustrating a configuration of chip architecture having a multi I/O line of a semiconductor memory device according to the principles of the present invention, which is comprised of FIGS. 4A and 4B arranged in a parallel pattern in a chip. The following description of the architecture of FIGS. 4A and 4B will be well understood, as compared to the conventional chip architecture of FIG. 1. FIG. 4 shows a new chip architecture according to the principles of the present invention, which discloses 256M DRAM as an embodiment thereof. In the figure, there are provided four banks, two of which are placed in upper and lower portions of FIG. 4A and the others are placed in upper and lower portions of FIG. 4B. A reference numeral 22 designates a single sub array, and 12 designates a single unit array. As shown in the figure, two sub arrays 22 exist in a bank and 16 unit arrays 12 exist in the one sub array 12.

Here, the one unit array 12 is comprised of 2M (M is equal to $2^{20}$), one sub array 22 is comprised of 32M, and one bank is comprised of 64M. Meanwhile, a row decoder 18 is arranged in the vertical direction of length of a chip (by which 64M is divided into 32M), and as shown in FIG. 4, the activation of memory cells is made in the direction of word lines. Thus, the unit arrays existing on the same line with each other in the direction of length of the chip are activated.

Figure 2:
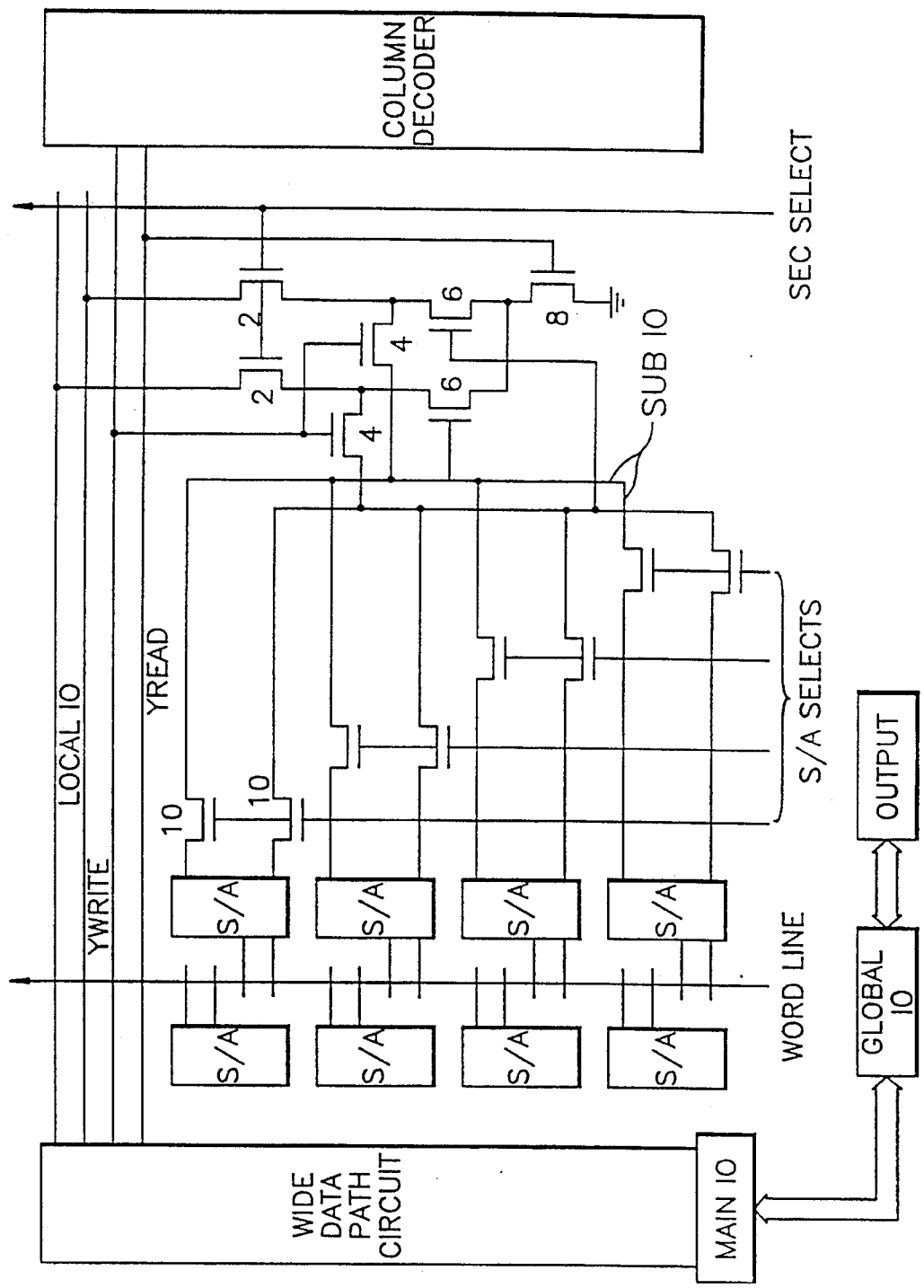
FIG. 2 is a circuit diagram illustrating configuration of data I/O lines in a conventional semiconductor memory device.
Figure 3:
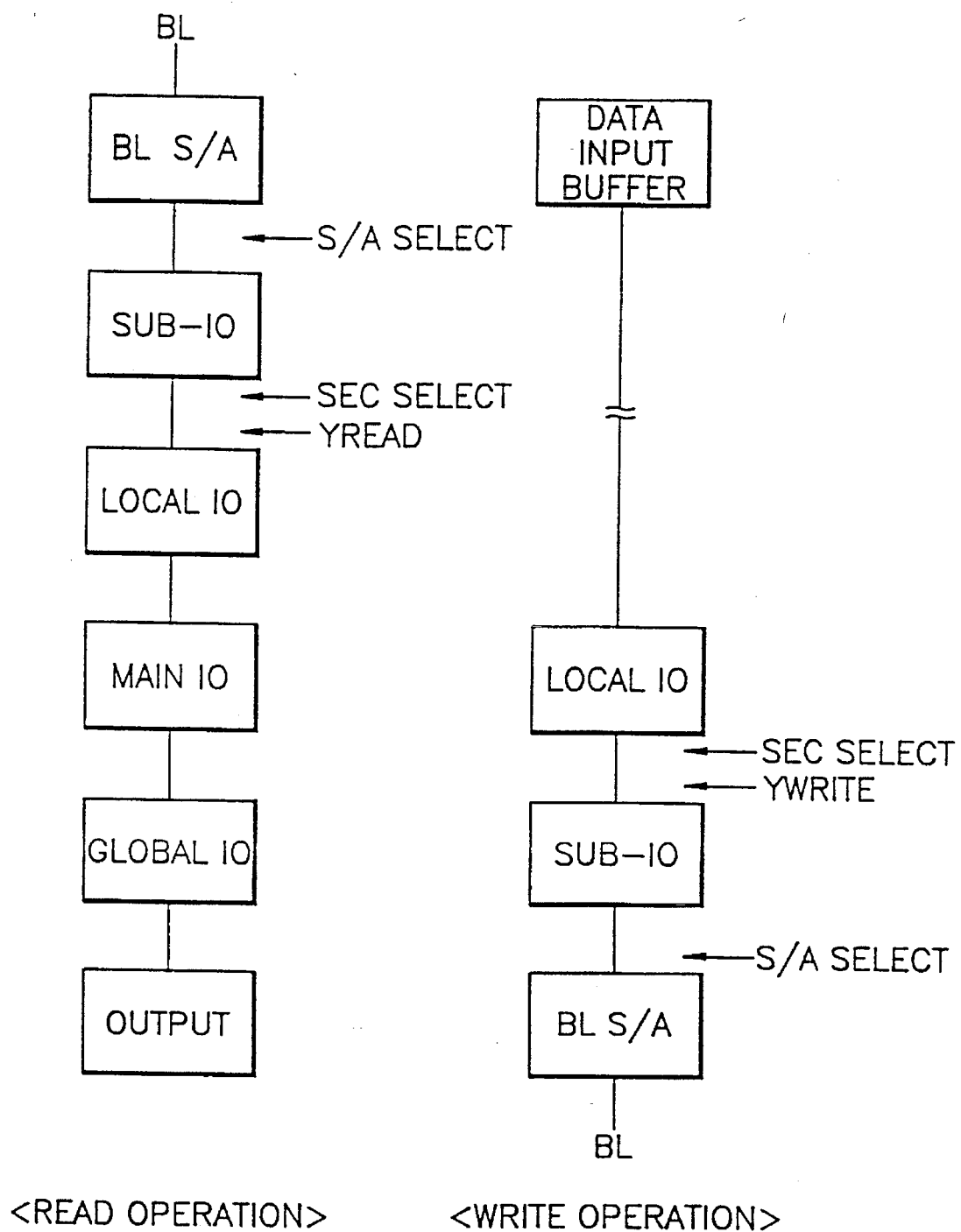
FIG. 3 is a schematic block diagram illustrating data I/O lines of FIG. 2.

In the above configuration, the bit lines, data I/O lines, and column selection lines are respectively arranged in a perpendicular direction to the word lines. At two sub arrays 22 adjacent to each other in one bank of FIG. 4A or 4B, one shows only data I/O lines IO, and the other shows only column selection lines CSL. This is to avoid confusion in understanding the configurations of data I/O lines IO and the column selection lines CSL. One sub array 22 has the same number of data I/O lines IO and column selection lines CSL as indicated in the figure. Meanwhile, in order to avoid interference between signals, it is desirable that the column selection lines be arranged without being directly adjacent to each other, and data I/O line IO and a complementary data I/O line $\overline{IO}$ be arranged without being directly adjacent to each other. A main feature of the architecture shown in FIG. 4 is that a large amount of data can be read at a time without having the local data I/O line as shown in FIG. 2, and a write operation can be performed at a high speed. This will be understood through the following description.

Under the above configuration, a method for achieving a high bandwidth in a chip architecture constructed according to the present invention will be discussed hereinafter. The unit array 12 constituting as a basic block the sub array 22 being of 32M is comprised of 16 numbers of 128K blocks including 512 word lines and 512 bit lines (i.e. 256 pairs of bit lines). One unit array 12 includes 4096 (256 column×16) pairs of bit lines. Here, when performing a refresh operation by a 16K unit, a single word line and an array of 2M are activated in the one bank of 64M, and the number of data I/O lines in the array of 2M is as follows: If $2^n$ pairs of bit lines are connected to a single data I/O line, $4096/2^n$ (being equal to $2^m$) pairs of data I/O lines are formed. When the predetermined number of data I/O lines is integrated through a multiplexer 20, a number $2^k$ of main data I/O lines MIO (which has a form of pair) can be obtained. In other words, in the array of 2M, $4096/2^n$ (being equal to $2^m$) data I/O lines and a number $2^k$ of main data I/O lines MIO as shown in FIG. 4 are obtained by activation of a row address signal $\overline{RAS}$. In the whole 256M, data of $2^k \times 4$ bits can be obtained. For example, if connecting 8 pairs of bit lines to a single data I/O line, the number of pairs of data I/O lines in the array of 2M is 512 ($2^n$=8), and if integrating 8 pairs of data I/O lines into a single main data I/O line MIO, the number of pairs of main data I/O lines MIO is 64. Therefore, if the 64 pairs of main data I/O lines MIO are arranged in one sub array 22, data of 256 bits can be obtained in the whole 256M. The chip architecture constructed according to the present invention has, in case a large number of bits is needed in a semiconductor memory device, a flexible ability for adjusting the number of pairs of bit lines connected to a data I/O line and the number of pairs of data I/O lines connected to a main data I/O line MIO.

Figure 5:
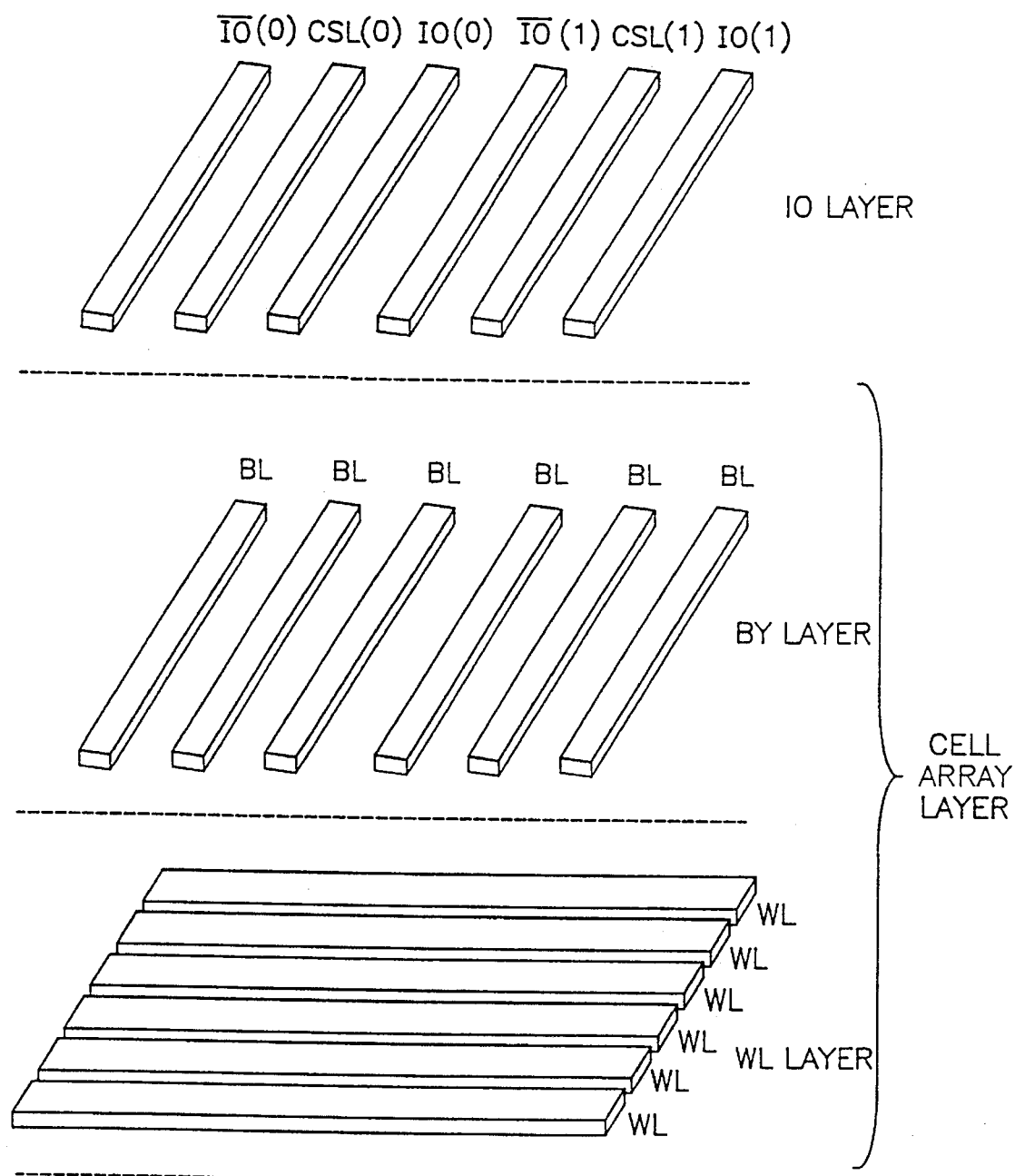
FIG. 5 is a diagram illustrating an example of a method for arranging the data I/O line and column selection line of FIG. 4.

FIG. 5 is a diagram illustrating an example of a method for arranging the data I/O lines and column selection lines of FIG. 4, which is useful in easily understanding the architecture of FIG. 4. In the figure, each of the column selection lines CSL is repeatedly arranged between each of the data I/O lines IO and the complementary data I/O lines $\overline{IO}$ in a chip. The construction of the architecture according to the present invention will now be compared with that in the conventional device. Even if it is assumed that a conventional method, as shown in FIG. 2, for arranging signal lines having data I/O lines and column information is, since an information signal S/A SELECT of the bit line is required by one line at each of the bit lines in view of reduction of chip size, arranged in the different direction from the data I/O lines, the information signal S/A SELECT requires data I/O lines, SEC SELECT line having column information, YREAD and YWRITE in the identical direction to each other. That is, two data I/O lines, one signal line SEC SELECT, and one line of signal YREAD or YWRITE are arranged in the identical direction to each other. It is inevitable that many data I/O lines are required for achieving a high bandwidth. For that reason, a basic structure having at least four lines is repeatedly arranged, thereby rendering the size of the chip to be large. However, in FIG. 5, since the data I/O line and column selection line are basically constructed with 3 lines repeatedly arranged, the size of the chip is thereby reduced. Further, since arrangement of the chip is made on the upper portion of the array, a sufficient number of data I/O lines required for achieving high bandwidth can be arranged. Meanwhile, since the column selection line is positioned between data I/O lines, the probability of coupling produced between data I/O lines IO and $\overline{IO}$ suppressed. Since the column selection lines are not adjacent between them, the identical effect to each other can be obtained. Of course, it is to be understood that the arranging method of FIG. 5 shows one preferred embodiment of the present invention. In addition, on the on-chip substrate, as shown in FIG. 5, between a layer where the data I/O lines IO and $\overline{IO}$ and the column selection line CSL exist and a substrate, a bit line layer and a word line layer respectively are arranged. Here, the bit lines are arranged in the same length direction as the data I/O line IO and $\overline{IO}$ and the column selection lines CSL and in parallel to each other. And the word lines are arranged in the direction perpendicular to the data I/O lines IO and $\overline{IO}$ and the column selection line CSL. In FIG. 5, the method of arranging the data I/O lines IO and $\overline{IO}$ and the column selection lines CSL is made by a basic structure having three $\overline{IO}$-CSL-IO lines, but it should be noted that another basic structure such as, for example, IO-CSL-$\overline{IO}$, or IO-$\overline{IO}$-CSL may be arranged in the repeated manner.

Figure 6:
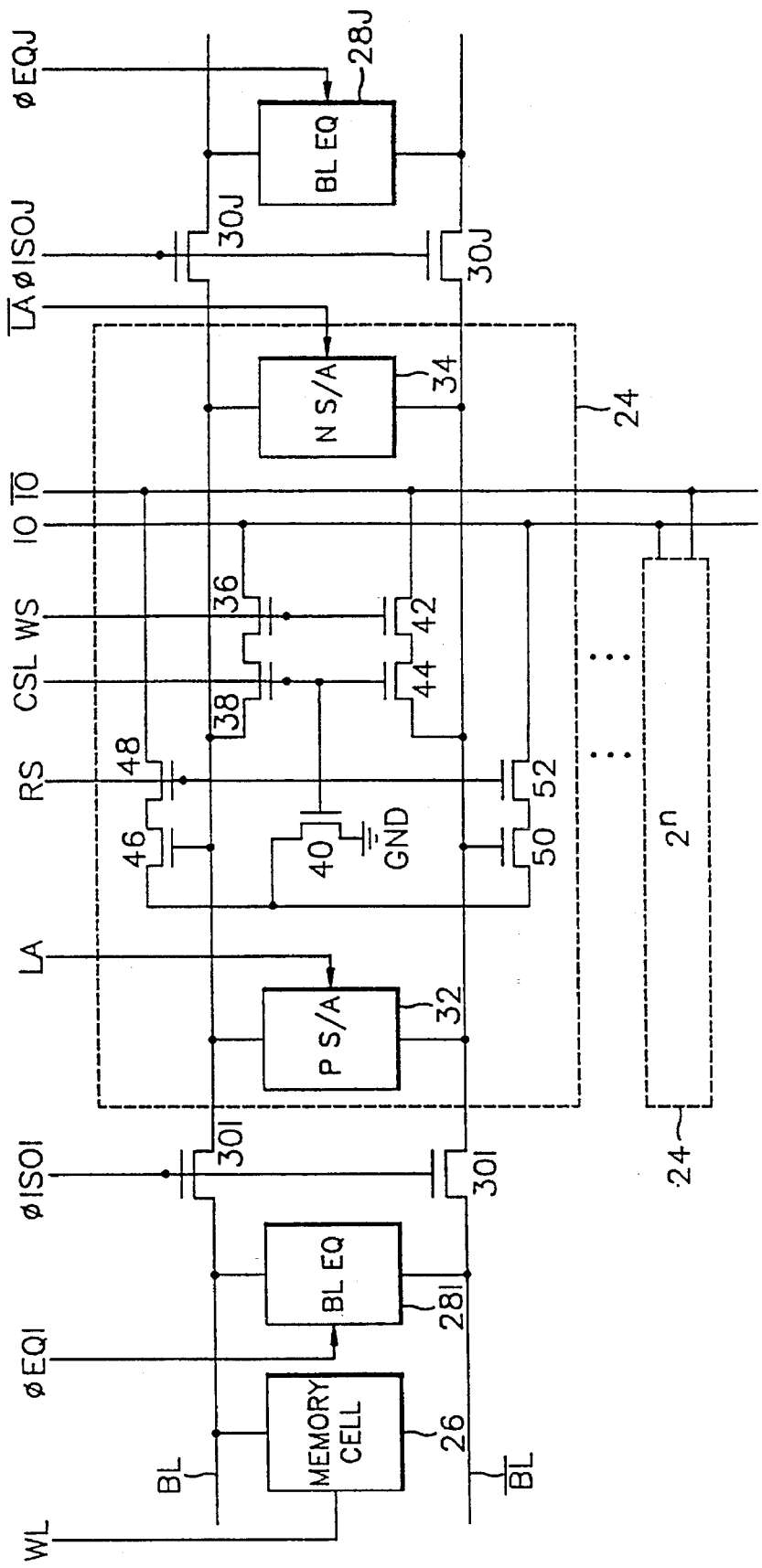
FIG. 6 is a detailed circuit diagram illustrating an embodiment of the column circuits of the chip architecture of FIG. 4.

FIG. 6 is a detailed circuit diagram illustrating an embodiment of the column circuits, i.e., a bit line sensing circuit of the chip architecture of FIG. 4. In the figure, the bit line sensing circuit indicated by a dotted block 24 is directly associated with a bit line sensing operation. In the configuration of bit line sensing circuit 24, a sense amplifier is comprised of a p-type sense amplifier 32 and an n-type sense amplifier 34, which are both arranged on bit lines BL and $\overline{BL}$, for developing data transmitted on the bit lines. Further, a write transistor 36 gate-inputs a write selection signal WS and is connected to data I/O line IO at a drain terminal thereof, and a write transistor 38 gate-inputs a column selection signal CSL (hereinafter called "column selection line" or "column selection signal", which are the same components) and has a channel connected between a source terminal of the write transistor 36 and the bit line BL. A charging transistor 40 gate-inputs the column selection signal CSL and is connected to a ground terminal GND at a source terminal thereof, and a write transistor 42 gate-inputs the write selection signal WS and is connected to the data I/O line $\overline{IO}$ at a drain terminal thereof. A write transistor 44 gate-inputs the column selection signal CSL and has a channel connected between a source terminal of the write transistor 42 and the bit line $\overline{BL}$, and a read transistor 46 is connected to the bit line BL at its gate terminal and connected to a drain terminal of the charging transistor 40 at a source terminal thereof. A read transistor 48 gate-inputs a read selection signal RS and has a channel connected between a drain terminal of the write transistor 46 and the data I/O line $\overline{IO}$, and a read transistor 50 is connected to the bit line $\overline{BL}$ at a gate terminal thereof and connected to the drain terminal of the charging transistor 40 at a source terminal thereof. Also, a read transistor 52 gate-inputs the read selection signal RS and has a channel connected between a drain terminal of the read transistor 50 and the data I/O line IO.

In addition to the components described above, there are further provided a memory cell 26 which is selected by activation of the word line WL, an equalization circuit 28I for equalizing left bit lines BL and $\overline{BL}$, a separating transistor 30I for separating the left bit lines BL and $\overline{BL}$, an equalization circuit 28J for equalizing right bit lines BL and $\overline{BL}$, and a separating transistor 30J for separating the right bit lines BL and $\overline{BL}$. Of course, these are known in the art. The read selection signal RS and write selection signal WS are arranged in the direction perpendicular to the data I/O lines IO and $\overline{IO}$ and column selection signal CSL, i.e., in the direction of the word line WL. Control signals of FIG. 6, that is, φEQ1, φISOI, LA, $\overline{LA}$, φISOJ and φEQJ are seen in Korean Patent Application No. 92-12436 filed on Jul. 13, 1992 by the present applicant, entitled "A Row Redundancy Circuit Sharing a Fuse Box". It should be noted that the configuration of the bit line sensing circuit 24 as shown in FIG. 6 can be variously made in accordance with that of the chip architecture of FIG. 4 according to the present invention.

Figure 7A:
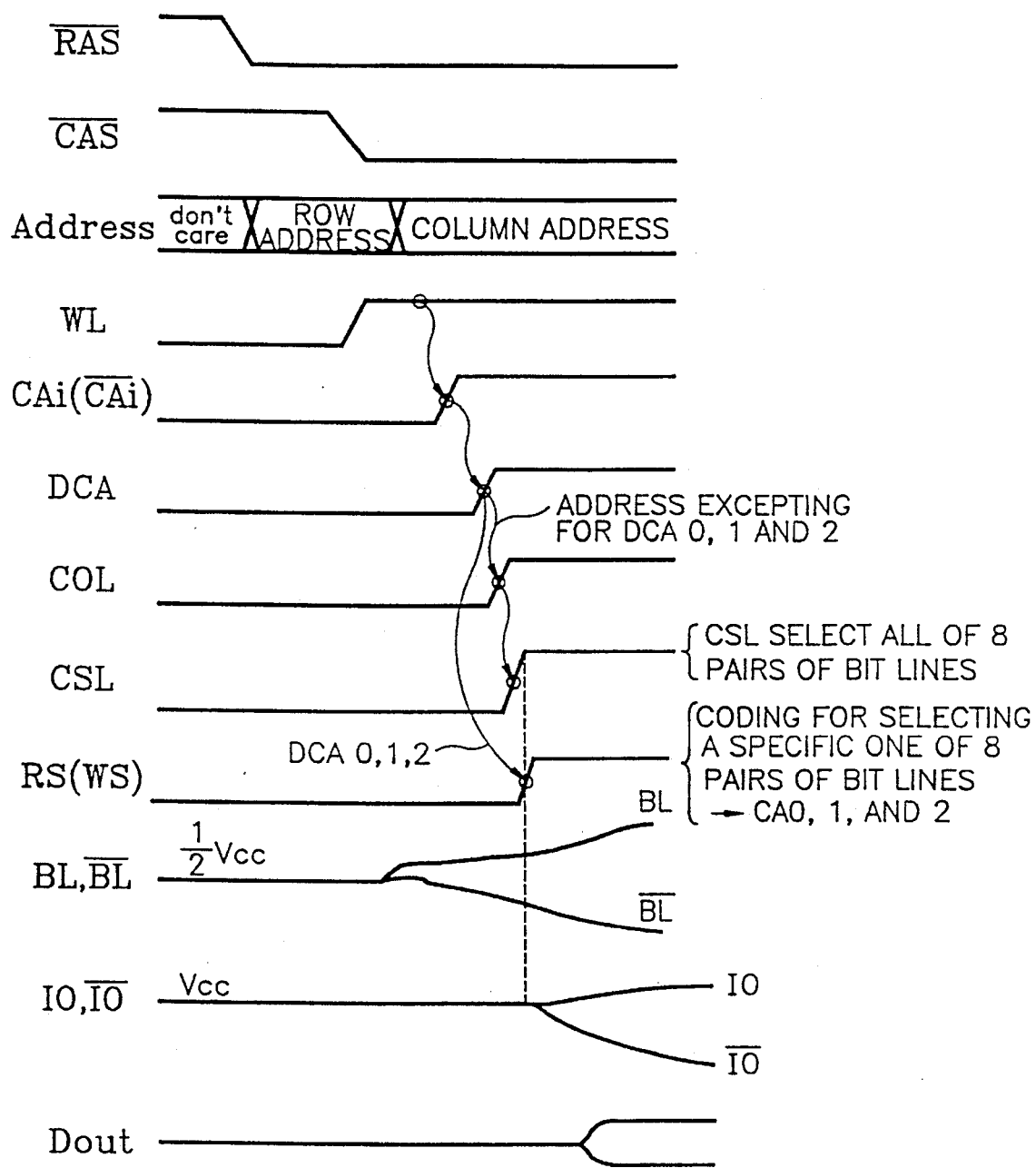
FIGS. 7A and 7B are timing diagrams illustrating read and write operations of a bit line sensing circuit 24 of FIG. 6.
Figure 7B:
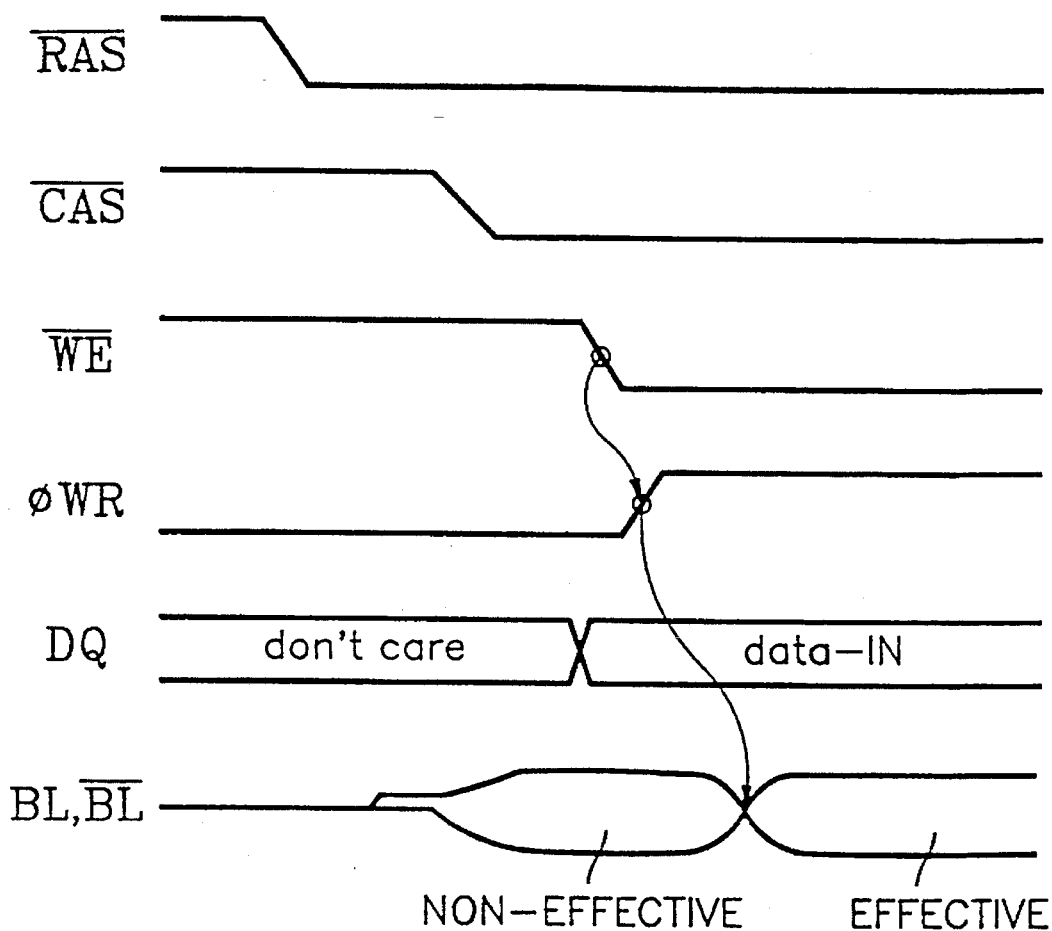

An explanation of the sensing operation, such as read and write operations of cell data, of the bit line sensing circuit 24 will be in detail given with reference to FIGS. 7A and 7B.

Firstly, upon performance of the read operation of FIG. 7A, it is well known that the row address and column address are inputted in synchronism with the activation of a row address strobe signal $\overline{RAS}$ and a column address strobe signal $\overline{CAS}$ and then a specific memory cell is designated. The present invention shows an embodiment where data of 256 bits is outputted in a 256M DRAM. As previously mentioned in FIG. 4, a pair of data I/O lines are connected to the 8 pairs of bit lines. Thus, one column selection line CSL serves to select eight pairs of bit lines connected to a specific pair of data I/O lines. In FIG. 7A, the read selection signal RS serves to select a desired pair of bit lines among the eight pairs of bit lines. Here, the read selection signal RS is generated by a specific combination of decoded addresses DCA 0, 1 and 2. Then, in FIG. 6, the data stored in the memory cell 26 is transmitted to the bit line BL by enabling the word line WL and a potential difference between the bit lines BL and $\overline{BL}$ in accordance with a level of the data is generated, thus developing the potential by the n-type sense amplifier 34. Hence, only one of the read transistors 46 and 50 is turned on in correspondence to the voltage level of the bit lines BL and $\overline{BL}$. At this time, the charging transistor 40 is previously turned on by the column selection signal CSL. Each of the read transistors 48 and 52 is turned on by the read selection signal RS. Then, a precharged voltage to the data I/O line IO or $\overline{IO}$ becomes discharged in dependence upon such switching paths as mentioned above. As a result, a voltage difference is generated between the data I/O lines IO and $\overline{IO}$, and the generated voltage difference is amplified by an amplifying means such as data I/O sense amplifier (not shown), which is an unnecessary means when the voltage difference is sufficiently generated between the data I/O lines IO and $\overline{IO}$) to be thereby transmitted to the main data I/O line MIO. Consequently, one of n pairs of bit lines (in the present invention, n is equal to 8) is selected by the read selection signal RS, and the selected pair of bit lines are transmitted to the data I/O line through the transistor for read 48 or 52. And, through the afore-mentioned path, data on the bit line is transmitted to the main data I/O line MIO.

Referring to contents described above with reference to FIG. 4, since 16 basic blocks of 128K is included within the unit array 12, and at the same time, the number of main data I/O lines MIO transmitting data on the one basic block is 4, 64 bits of data within a single sub array 22 can be obtained through 64 main data I/O lines MIO.

On the other hand, upon performance of the write operation of FIG. 7B, when a given data is received through a data input buffer (not shown) from the exterior of the chip and then transmitted to the main data I/O line MIO or $\overline{MIO}$, the transmitted data proceeds to the data I/O lines IO or $\overline{IO}$. A write operation for the transmitted data is operated at a high speed by the enable of the column selection signal CSL of a given selected column and by the write signal WS (which signal selects one of 8 pairs of bit lines), through the write transistors 36 and 38 or 42 and 44, that is, through two NMOS transistors.

Figure 8:
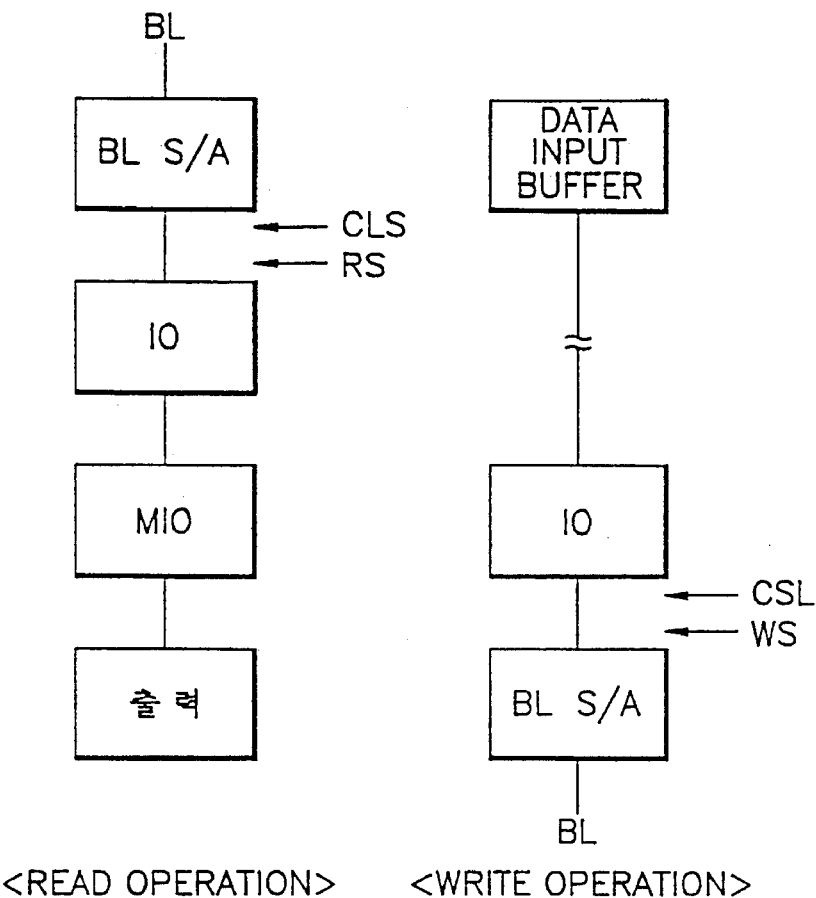
FIG. 8 is a schematic block diagram illustrating data I/O paths of FIG. 6.

FIG. 8 is a schematic block diagram illustrating the data I/O path of FIG. 6, which schematically shows processes of read and write operations.

Under the architecture constructed according to the principle of the present invention, it is appreciated that the local data I/O line as shown in FIG. 2 is separately not required for achieving a high bandwidth of 256 bits. Therefore, a solution of the problem concerning a line loading can be found in only the main data I/O line and data I/O line, thus reducing the seriousness of the loading problem when compared with that in FIG. 2. Further, the architecture constructed according to the principle of the present invention has more evident advantages in improvement of a write speed and reduction of a size of a high density memory device than FIG. 2. In the conventional architecture, five signal lines, for example, local data I/O line LOCAL I/O, sub data I/O line SUB I/O, write enable signal line YWRITE, read enable signal line YREAD and column selection line CSL are arranged in the direction of a column. However, in the present invention, three signal lines, for example, main data I/O line MIO, data I/O line IO and column selection line CSL are arranged. This contributes to the high integration of the semiconductor memory device. Also, under the architecture constructed according to the principle of the present invention, the word line WL, read selection line RS and write selection line WS are arranged in the direction of the length of the memory device, and the bit line, data I/O line IO and column selection line CSL are arranged in the direction perpendicular to the word line, thereby effectively receiving and generating data of multi bits. As previously described, when connecting $2^n$ pairs of data I/O lines with a pair of data I/O lines, $2^m$ pairs of data I/O lines and $2^m$ pairs of column selection lines are accordingly required. Thus, the basic block according to the present invention has a layout where a pair of data I/O lines and one column selection line are regularly arranged in the direction perpendicular to the word line. This results in a reduction of layout area occupied for drawing multi I/O data.

The construction of FIG. 4 for multiplexing the data I/O line IO and main data I/O line MIO will be described with reference to FIG. 9. This figure shows an embodiment of a multiplexer 20 of FIG. 4, in which a plurality of unit multiplexers 60 is included in the single multiplexers 20. Here, since the architecture of FIG. 4 is constructed to output data of 256 bits, it can be appreciated that one unit multiplexer 60 is contained per 8 pairs of data I/O lines.

Figure 9:
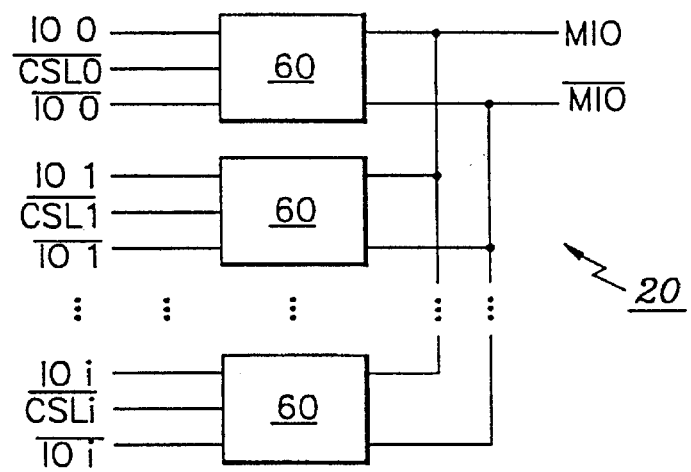
FIG. 9 is a block diagram illustrating an embodiment of a multiplexer 20 of FIG. 4.
Figure 10:
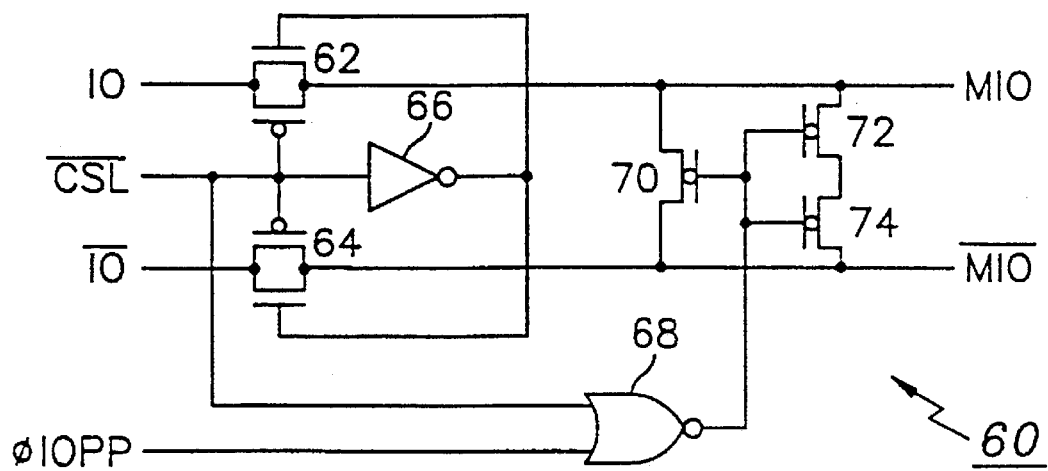
FIG. 10 is a circuit diagram illustrating an embodiment of a unit multiplexer 60 in the multiplexer 20 of FIG. 9.

FIG. 10 is a circuit diagram illustrating an embodiment of the unit multiplexer 60 in the multiplexer 20 of FIG. 9. Under the configuration, there are provided a transmission gate 62 which gate-inputs the column selection signal CSL and its complementary signal $\overline{CSL}$ and which is arranged between the data I/O line IO and main data I/O line MIO, a transmission gate 64 which gate-inputs the column selection signals CSL and $\overline{CSL}$ and arranged between the complementary data I/O line $\overline{IO}$ and main data I/O line $\overline{MIO}$, a NOR gate 68 which inputs the complementary column selection signal $\overline{CSL}$ and a signal $\phi IOPP$, a PMOS transistor 70 which gate-inputs an output signal of the NOR gate 68 and has a channel arranged between the main data I/O lines MIO and $\overline{MIO}$, for equalizing the two signal lines, and PMOS transistors 72 and 74 which commonly gate-input the output signal of the NOR gate 68 and have a channel arranged in parallel between the main data I/O line MIO and $\overline{MIO}$, for precharging each of the two signal lines. It should be noted in the construction of FIGS. 9 and 10 that only selected data I/O lines IO and $\overline{IO}$ and the column selection line CSL corresponding thereto are enabled, thus transmitting an output to the main data I/O lines MIO and $\overline{MIO}$.

Figure 11:
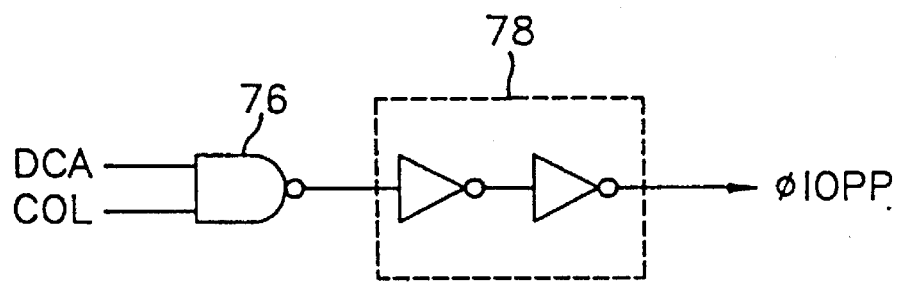
FIG. 11 is a circuit diagram illustrating an embodiment of a circuit for generating a signal φIOPP inputted to the multiplexer 20 of FIG. 10.

FIG. 11 is a circuit diagram illustrating an embodiment of a circuit for generating a signal $\phi IOPP$ inputted to the multiplexer 20 of FIG. 10. In this figure, enabling processes of input signals DCA and COL was described with reference to FIG. 7.

While the preferred embodiment of the present invention has been shown and described, it will be understood by those skilled in the art that changes in form and details may be made to the foregoing without departing from the spirit and scope of the present invention.

As previously explained, a semiconductor memory device and method for arranging signal lines therein which are embodied by a chip architecture where a high bandwidth can be realized without having to increment the size of a chip. In addition, the semiconductor memory device and method for arranging signal lines therein has advantages that layout in the column direction as well as in the row direction can be constructed in a simple manner by activating the array in the length direction of a chip, and a line loading problem can be minimized by requiring only two data I/O lines serving to transmit data between a cell array and the input/output terminals of the chip. Further, the semiconductor memory device and method for arranging signal lines therein has an advantage that a desired number of high bandwidth can be achieved by adjusting the connecting methods of bit line and data I/O line and of data I/O line and main data I/O line.

What is claimed is:

1. A semiconductor memory device comprising:

an array comprised of a plurality of memory cells;

a plurality of word lines extending in a first direction of a chip;

a plurality of bit line pairs extending in a second direction perpendicular to said first direction, each of said plurality of bit line pairs comprised of a bit line and a complementary bit line;

a plurality of data I/O line pairs arranged above said array and extending in said second direction, each of said plurality of data I/O line pairs comprised of a data I/O line and a complementary data I/O line and capable of being respectively connected to each of said bit line pairs, and a plurality of column selection lines arranged in said second direction and adjacent to respective ones of said plurality of said data I/O line pairs, for operably connecting each of said plurality of bit line pairs to said respective ones of said plurality of data I/O line pairs.

2. The semiconductor memory device as claimed in claim 1, wherein each column selection line is arranged between said data I/O line and said complementary data I/O line of said respective data I/O line pair.

3. A semiconductor memory device comprising:

a plurality of word lines extending in a first direction of a chip;

a plurality of unit arrays, each comprised of a plurality of memory cells and arranged in said first direction;

a plurality of bit line pairs extending in a second direction perpendicular to said first direction of said chip, each of said plurality of bit line pairs comprised of a bit line and a complementary bit line;

a row decoder for enabling said plurality of word lines;

a column decoder for enabling said plurality of bit line pairs;

a plurality of data I/O line pairs arranged in said second direction, each of said plurality of data I/O line pairs comprised of a data I/O line and a complementary data I/O line and capable of being respectively connected to each of said bit line pairs;

a plurality of column selection lines arranged in said second direction and adjacent to respective ones of said plurality of said data I/O line pairs, for operably connecting each of said plurality of bit line pairs to said respective ones of said plurality of data I/O line pairs; and a plurality of main data I/O lines extending in said second direction, each of said plurality of main data I/O lines capable of being respectively connected to each of said plurality of data I/O line pairs, thereby activating said unit arrays upon activation of said chip.

4. A semiconductor memory device comprising:

a plurality of memory cell blocks;

a plurality of unit arrays comprised of said plurality of memory cell blocks arranged in a first direction of said chip;

a sub array comprised of said plurality of unit arrays arranged in a second direction perpendicular to said first direction of said chip;

a plurality of word lines extending in said first direction;

a plurality of bit line pairs extending in said second direction, each of said plurality of bit line pairs comprised of a bit line and a complementary bit line;

a plurality of data I/O line pairs arranged above said sub array and extending in said second direction, each of said plurality of data I/O comprised of a data I/O line and a complementary data I/O line and capable of being respectively connected to each of said bit line pairs;

a column gate for respectively connecting each of said bit line pairs to each of said plurality of data I/O line pairs;

a plurality of column selection lines extending in said second direction, for controlling said column gate;

a plurality of main data I/O lines capable of being respectively connected to each of said plurality of data I/O line pairs; and a multiplexer for connecting each of said plurality of data I/O line pairs to a respective pair of said plurality of main data I/O lines, thereby accessing an amount of data corresponding to the number of said main data I/O lines from each of said unit arrays.

5. A semiconductor memory device comprising:

a plurality of unit arrays comprised of a plurality of memory cell blocks and arranged in a first direction of a chip;

a sub array comprised of said plurality of unit arrays and arranged in a second direction perpendicular to said first direction of said chip;

a plurality of word lines extending in said first direction of said chip, for selecting memory cells in said plurality of memory cell blocks;

a plurality of bit line pairs extending in said second direction or said chip;

a plurality of data I/O line pairs extending in said second direction and capable of being respectively connected to each of said plurality of bit line pairs of $2^n$, each of said plurality of data I/O line pairs comprised of a data I/O line and a complementary data I/O line;

a read selection signal line for selecting one of said plurality of bit line pairs of $2^n$ connected to a respective pair of data I/O lines in correspondence with a column address, upon performance of a read operation;

a write selection signal line for selecting said one of said plurality of bit line pairs of $2^n$ connected to said respective pair of data I/O lines in correspondence with said column address, upon performance of a write operation;

a column gate for respectively connecting each of said plurality of bit line pairs to each of said plurality of data I/O line pairs;

a column selection line extending in said second direction, for controlling said column gate; and a plurality of main data I/O lines capable of being respectively connected to each of said plurality of data I/O line pairs through a multiplexer.

6. The semiconductor memory device as claimed in claim 5, wherein said read selection signal line and said write selection signal line extend in said first direction of said chip.

7. A method for arranging signal lines in a semiconductor memory device comprising the steps of:

arranging an array comprised of a matrix of a plurality of memory cells;

arranging a plurality of word lines for selecting rows of said plurality of memory cells, said plurality of word lines extending in a first direction of a chip;

arranging a plurality of bit line pairs for selecting columns of said plurality of memory cells, each of said plurality of bit line pairs comprised of a bit line and a complementary bit line and extending in a second direction perpendicular to said first direction of said chip;

arranging a plurality of data I/O line pairs above said array and extending in said second direction, each of said plurality of data I/O line pairs comprised of a data I/O line and a complementary data I/O line and capable of being respectively connected to each of said plurality of bit line pairs; and arranging a plurality of column selection lines adjacent to respective ones of said data I/O line pairs, for operably connecting each of said plurality of bit line pairs to said respectives one of said data I/O line pairs in said second direction.

8. The method for arranging signal lines in the semiconductor memory device as claimed in claim 7, wherein each column selection line is arranged between said data I/O line and said complementary data I/O line of said respective data I/O line pair.

\* \* \* \* \*